(12) United States Patent
    Takagi

(10) Patent No.: US 11,711,897 B2
(45) Date of Patent: Jul. 25, 2023

(54) POWER CONVERSION DEVICE

(71) Applicant: Mitsubishi Electric Corporation, Tokyo (JP)

(72) Inventor: Toshikazu Takagi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/027,815

(22) Filed: Sep. 22, 2020

(65) Prior Publication Data

US 2021/0176869 A1    Jun. 10, 2021

(30) Foreign Application Priority Data

Dec. 5, 2019  (JP) ................. 2019-220064

(51) Int. Cl.
| | |
|---|---|
| H01L 23/40 | (2006.01) |
| H05K 3/42 | (2006.01) |
| H05K 1/02 | (2006.01) |
| H05K 7/20 | (2006.01) |
| H05K 3/46 | (2006.01) |
| H05K 3/32 | (2006.01) |
| H02M 7/00 | (2006.01) |
| H01L 23/367 | (2006.01) |

(52) U.S. Cl.
CPC ......... *H05K 3/429* (2013.01); *H01L 23/3675* (2013.01); *H01L 23/4006* (2013.01); *H02M 7/003* (2013.01); *H05K 1/0215* (2013.01); *H05K 3/32* (2013.01); *H05K 3/46* (2013.01); *H05K 7/20436* (2013.01); *H01L 2023/4018* (2013.01); *H05K 2201/10409* (2013.01)

(58) Field of Classification Search
None
See application file for complete search history.

(56) References Cited

U.S. PATENT DOCUMENTS 5,110,664 A * 5/1992 Nakanishi ........... H01L 23/5383
                                            428/195.1
7,906,840 B2 * 3/2011 Otsuka ................. H01L 23/552
                                            257/678

(Continued)

FOREIGN PATENT DOCUMENTS

| JP | 2009-135372 A | 6/2009 |
| JP | 2014-090018 A | 5/2014 |

*Primary Examiner* — Courtney L Smith
(74) *Attorney, Agent, or Firm* — Sughrue Mion, PLLC; Richard C. Turner (57) ABSTRACT

The power conversion device includes: a main circuit having first and second wiring layers formed respectively on both surfaces of a base board, mounted parts mounted on the first and second wiring layers, and first and second GND layers formed respectively, between external- and internal-layer portions of the base board and in regions corresponding to the mounted parts each being a mounted part which forms a circuit other than a circuit having an inductance component as a lumped constant, and to the first and second wiring layers; and a cooler attached to the base board by means of fixing screws through a first through-hole created in an end portion of the board; wherein the first and second GND layers are each formed so that creepage distance is created around a second through-hole in which a lead insertion part that mutually connects the first and second wiring layers is inserted.

12 Claims, 6 Drawing Sheets

(56) References Cited

U.S. PATENT DOCUMENTS

| | | | |
|---|---|---|---|
| 8,536,737 B2* | 9/2013 | Azancot | H02J 50/40 |
| | | | 307/104 |
| 2002/0015293 A1* | 2/2002 | Akiba | H01L 23/552 |
| | | | 361/793 |
| 2007/0090398 A1* | 4/2007 | McKinzie, III | H05K 1/0239 |
| | | | 257/192 |
| 2008/0105456 A1* | 5/2008 | Kawaguchi | H05K 3/4691 |
| | | | 174/255 |
| 2016/0104569 A1* | 4/2016 | Kato | H01F 27/343 |
| | | | 336/105 |
| 2017/0170800 A1* | 6/2017 | Saito | H01F 17/0013 |
| 2018/0076853 A1* | 3/2018 | Kuroda | H05K 1/0243 |

* cited by examiner

POWER CONVERSION DEVICE

BACKGROUND OF THE INVENTION

1. Field of the Invention

The present application relates to a power conversion device.

2. Description of the Background Art

Heretofore, with respect to a multilayer printed wiring board used for a power conversion device, when a main circuit current is to be flowed through a wiring layer related to an AC (Alternating Current)-DC (Direct Current) converter, a DC-DC converter, an inverter or the like and placed on a base board, in order to limit that current within an allowable current determined depending on the glass-transition temperature of the base board, such a method or the like has been taken as a measure in which a copper-foil thickness of the wiring layer is increased or the number of wiring layers of the board is increased, to thereby decrease the wiring impedance. Meanwhile, a measure for heat dissipation has been taken by providing such a structure that directly or indirectly cools the wiring layers to thereby create thermal paths.

On the other hand, as a measure against noise, it is necessary to provide such a filter for dealing with normal-mode/common-mode noise that is composed of an across-the-line capacitor (hereinafter, referred to as "X-Cap"), a line capacitor (hereinafter, referred to as "Y-Cap"), a coil and the like; and to perform designing in consideration of: parasitic capacitances between the component parts, the wiring layers and the housing; and parasitic inductor components. When actually the designing is performed precisely, various limiting conditions are present. This complicates the designing.

According to the grounding structure of a conventional printed wiring board, an internal-layer GND (Ground) pattern in the printed wiring board is connected to the housing through a through-hole and a terminal block mounted by means of a fixing screw(s). Because the terminal block is interposed between the internal-layer GND pattern of the printed wiring board and the housing, the connection impedance is increased, so that a problem has arisen that a potential difference is produced between the printed wiring board and the housing, acting as a cause for noise generation. Further, it has been required for the terminal block to ensure amounting area that is twice the area for the fixing screw(s), and this has caused a restriction for downsizing the product.

In this respect, in Patent Document 1, a printed wiring board is disclosed which has a configuration in which GND connection between the internal-layer GND pattern in the printed wiring board and the housing is established through such through-holes that penetrate both the printed wiring board and a conductor land, at around a screw hole, so that the connection impedance between the printed wiring board and the housing is decreased and thus noise can be reduced.

Meanwhile, with respect to a conventional circuit module, it is required that at least one surface of a special-form part be fixed to a heatsink or the like. The method of such fixing to the heatsink is difficult depending on the number of the special-form parts and the shape of the special-form part. As a result, according to the conventional mounting structure of the special-form part, there is a problem that, when a tensile force is transferred from the outside to the insulative base board, etc., the screw may be broken, the special-form part may be deformed, or the special-form part itself is peeled off from the heatsink. Further, there is a problem that it is difficult to place contiguously to that module, a circuit board on which general electronic parts for controlling a power semiconductor device and the special-form part, are mounted. Furthermore, there is a problem that the method of fixing the circuit module to the heatsink or the like, is difficult.

In this respect, in Patent Document 2, a circuit module is disclosed:

in which, using a resin structure, the special-form part is at least partly fixed thereto, so that the special-form part is tightly fixed even if it has any one of a variety of shapes, weights and volumes;

in which, using the resin structure to which the special-form part is at least partly fixed, a connection wiring portion corresponding to a part of the lead frame that constitutes a heat-dissipation board, is fixed thereto, so that peeling strength from a heat transfer layer, of the connection wiring portion or the lead frame itself is enhanced, and the heat-dissipation board itself is highly strengthened; and further, in which a circuit board that mounts thereon general electronic parts for controlling the power semiconductor device and the like mounted on the heat-dissipation board, is placed substantially parallel to the heat-dissipation board, so that downsizing of the circuit module is achieved and the noise resistance characteristic is enhanced.

Patent Document 1: Japanese Patent Application Laid-open No. 2014-90018 (paragraph 0010; FIG. 1)

Patent Document 2: Japanese Patent Application Laid-open No. 2009-135372 (paragraphs 0013 to 0015; FIG. 1)

In the case of Patent Document 1, decreasing the impedance is an effective way for reducing noise; however, it is necessary to ensure a creepage distance and thus, there is a problem that it is necessary to ensure insulation between a high-voltage side and a low-voltage side of a wiring pattern. Further, in the case of Patent Document 2, a main circuit and a control-system circuit are structurally separated from each other, namely, a main circuit unit in which the heat-generating power semiconductor device and the like are mounted is placed on the heat-dissipation board-side, and the circuit board is placed substantially parallel to the heat-dissipation board, so that an improvement in heat-dissipation capability can be achieved; however, there is a problem that, when the heat-dissipation board and the circuit board are mixed boards, it is necessary to enlarge the required site area for mounting. In addition, when the board area is enlarged, electrical length of each of the circuits becomes longer, thus causing loss in patterns and loss due to noise and resonance according to occurrence of resonance associated with the operation of the main circuit, so that there is a problem that the efficiency of the power conversion device is decreased and the noise resistance performance is deteriorated.

SUMMARY OF THE INVENTION

The present application discloses a technology to solve the problems as described above, and an object thereof is to provide a power conversion device which can not only suppress generation of noise and ensure the heat dissipation capability, but also can achieve downsizing and cost reduction.

A power conversion device disclosed in this application is characterized by comprising:

a main circuit which has: a first wiring layer and a second wiring layer that are formed respectively on both surfaces of a base board; mounted parts that are mounted on the first wiring layer and the second wiring layer, said mounted parts including a mounted part which forms a circuit having an inductance component as a lumped constant and mounted parts which form each a circuit other than a circuit having an inductance component as a lumped constant; and a first GND layer and a second GND layer that are formed respectively, between the external-layer portions and the internal-layer portion of the base board and in regions corresponding to the mounted parts which form each a circuit other than a circuit having an inductance component as a lumped constant, and to the first wiring layer and the second wiring layer; and a cooler which is attached to the base board by means of a fixing screw through a first through-hole created in an end portion of that board;

wherein the first GND layer and the second GND layer are each formed so that a creepage distance is created around a second through-hole in which a lead of one of the mounted parts which form each a circuit other than a circuit having an inductance component as a lumped constant, that connects the first wiring layer and the second wiring layer to each other, is inserted.

According to the power conversion device of this application, heat-dissipation paths are created around the target parts and wiring layers in the main circuit, so that heat generation at the parts and wiring layers can be reduced, and this allows to flow a much larger current and to reduce the board cost. Further, the noise resistance performance can be enhanced.

DETAILED DESCRIPTION OF THE EMBODIMENTS OF THE INVENTION

Embodiment 1

Figure 1:
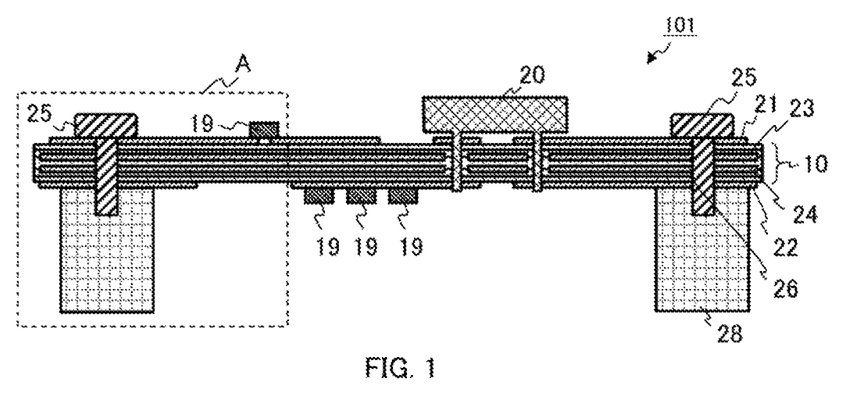
FIG. 1 is a sectional view showing a configuration of a main circuit of a power conversion device according to Embodiment 1.
Figure 2:
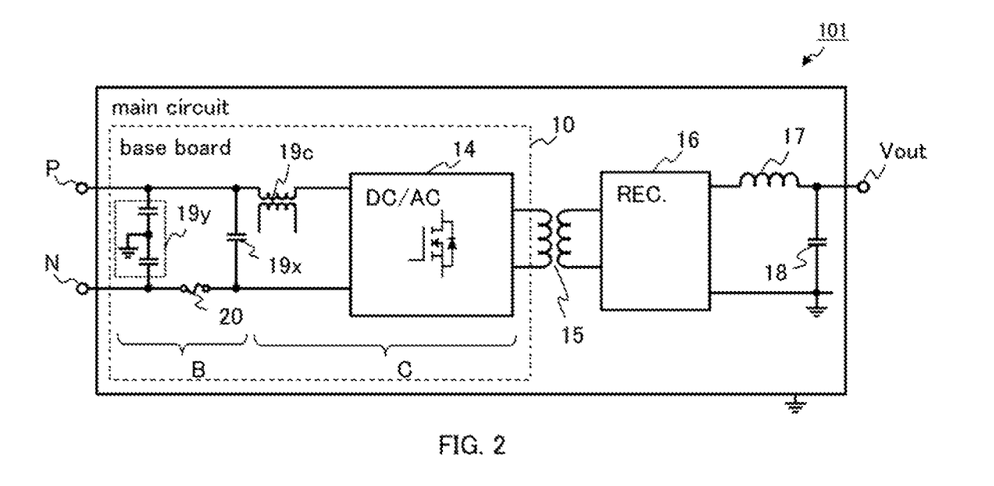
FIG. 2 a circuit diagram showing a configuration of the main circuit of the power conversion device according to Embodiment 1.
Figure 3:
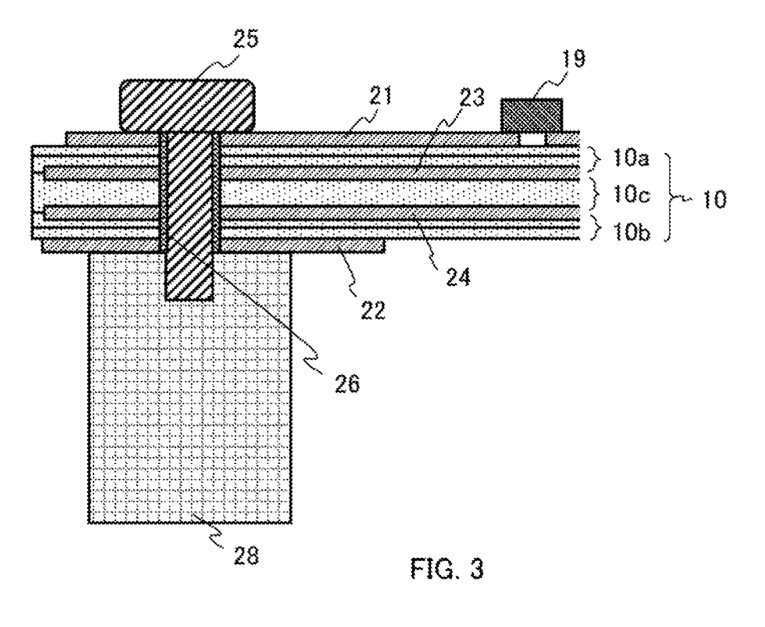
FIG. 3 is an enlarged sectional view showing a configuration of the main circuit of the power conversion device according to Embodiment 1.
Figure 4A:
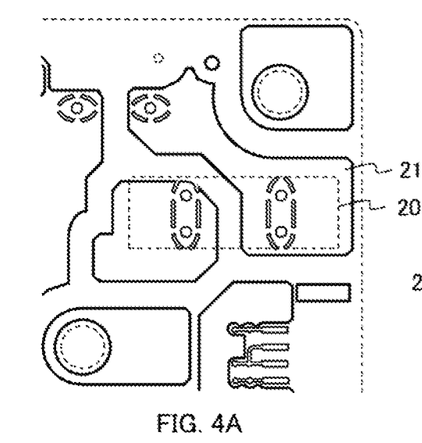
FIGS. 4A to 4D are plan views showing a configuration of wiring layers in the main circuit of the power conversion device according to Embodiment 1.
Figure 4B:
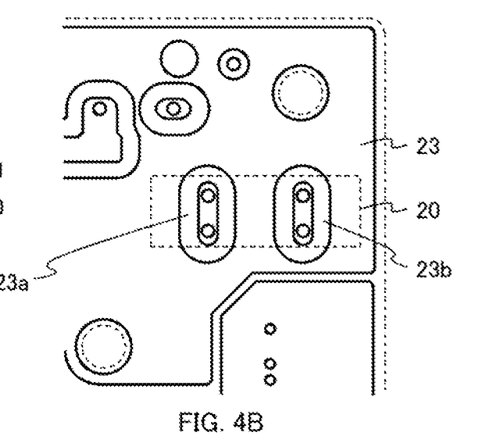
Figure 4C:
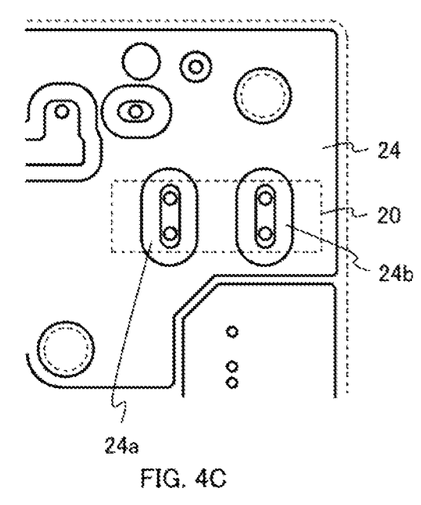
Figure 4D:
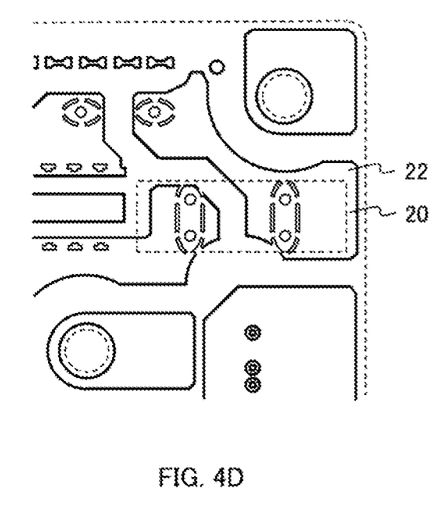

FIG. 1 is a sectional view showing a configuration of a main circuit of a power conversion device according to Embodiment 1. FIG. 2 is a circuit diagram showing a configuration of the main circuit of the power conversion device. FIG. 3 is an enlarged sectional view of a region A in FIG. 1.

As shown in FIG. 1, a main circuit 101 of the power conversion device of Embodiment 1 is configured with: a baseboard 10; a first wiring layer 21 and a second wiring layer 22 formed on the both surfaces of the base board 10; a first GND layer 23 and a second GND layer 24 formed in internal regions of the base board 10 so as to be placed under the first wiring layer 21 and the second wiring layer 22, respectively; surface mount parts 19 each placed on one side of the surfaces of the base board 10 and connected to the first wiring layer 21 or the second wiring layer 22; a lead insertion part 20 placed on one side of the surfaces of the base board 10 and connected to the first wiring layer 21 and the second wiring layer 22; through-holes 26 as first through-holes that are each created in an end portion of the base board 10 so as to penetrate the first wiring layer 21, the first GND layer 23, the second GND layer 24 and the second wiring layer 22; and a cooler (or housing) 28 attached by means of fixing screws 25 passing through the through-holes 26.

The main circuit of the power conversion device includes: the surface mount parts 19, for example, an X-Cap, a Y-Cap and the like, as well as a part such as an AC-DC converter, a DC-DC converter, an inverter or the like; and the lead insertion part 20 such as a fuse 20f or the like; which are to be mounted on a printed circuit board.

The power conversion device shown in FIG. 2, which is an example with an AC-DC converter, is a power converter for converting desired power into a DC voltage. DC-AC conversion is performed by activating: filter parts such as an X-Cap 19x, a Y-Cap 19y and the like; the fuse 20; a current transformer 19c for sensing a current; and a DC-AC circuit unit 14 comprising a MOSFET (Metal-Oxide Silicon Field-Effect Transistor), an IGBT (Insulated Gate Bipolar Transistor), or a next-generation semiconductor element such as a wide bandgap semiconductor element or the like. Then, the power is transmitted across the primary and secondary sides of a transformer 15, and converted (rectified) from an alternating current into a direct current by a rectifier circuit 16 (hereinafter, referred to as REC), which is then outputted (Vout) after being smoothed by a smoothing coil 17, a smoothing capacitor 18 and the like. The power conversion device is configured with such a main circuit serving as a power plant, and a control circuit (not illustrated) for controlling and activating that main circuit. The control circuit is configured with: a voltage sensor circuit for sensing a voltage inputted to or outputted from the main circuit; a current sensor circuit for sensing an input current from the current transformer; a driver circuit for activating the DC-AC circuit unit in the main circuit; and a control unit (for example, an arithmetic control circuit, such as a controller IC, a microprocessor or the like) for activating the driver circuit on the basis of the outputs of the above sensor circuits.

As shown in FIG. 3, the main circuit 101 of the power conversion device of Embodiment 1 in the present application is characterized in that: the surface mount parts 19 such as the X-Cap 19x, the Y-Cap 19y and the like, and the lead insertion part 20 such as the fuse 20f or the like, are mounted on the first wiring layer 21 and the second wiring layer 22 formed on the both surfaces of the base board 10; the first GND layer 23 and the second GND layer 24 are provided in areas corresponding to the first wiring layer 21 and the second wiring layer 22, respectively, to be placed between the first wiring layer 21 and an internal-layer portion 10c and between the second wiring layer 22 and said internal-layer portion, with interposed external-layer portions 10a, 10b made of prepregs, respectively; and the first GND layer and the second GND layer are used as heat-dissipation paths, so that heat is dissipated to the cooler 20 attached by means of the fixing screws 25 through the through-holes 26. Here, it is preferable that each of the intervals between the first wiring layer 21 and the first GND layer 23 and between the second wiring layer 22 and the second GND layer 24 be not less than 120 μm but not more than 300 μm.

When this is the case, the first GND layer 23 and the second GND layer 24 are placed close to the parts or wiring layers to be cooled, through a solid insulative layer and without contact with the atmosphere, so that it is possible to enhance the heat-dissipation effect while ensuring the dielectric strength. For example, in the case of a lead insertion part such as a fuse or the like, a GND layer, when it is an internal-layer portion, can be placed closer to a region corresponding to a VIA interval for the lead insertion part, than when it is a surface-layer portion, and thus the thermal resistance in the heat-dissipation path can be decreased, so that the heat-dissipation capability is enhanced.

It is noted that, among the layers of the board, the layers at the same potential are subjected to VIA connection in consideration of the insulation distance between the layers. For example, when wire-connection is made between patterns of a front-side layer and a back-side layer, these patterns are connected to each other through multiple through-holes each as a second through-hole; however, with respect to the relevant patterns, no GND layer is placed around the through-holes in consideration of the creepage distance. FIGS. 4A to 4D are examples when wiring patterns around the fuse 20 were actually applied to the first wiring layer 21 (FIG. 4A), the first GND layer 23 (FIG. 4B), the second GND layer 24 (FIG. 4C) and the second wiring layer 22 (FIG. 4D) (perspective views seen from the first wiring layer 21-side). As shown in FIGS. 4A to 4D, at around the through-hole-vias as lead insertion ports for each fuse 20, the first GND layer 23 (FIG. 4B) and the second GND layer 24 (FIG. 4C) are provided with regions 23a, 23b, 24a, 24b in which no GND layer is placed.

By employing such a configuration, heat-dissipation paths are created around the target parts and wiring layers in the main circuit, so that heat generation at the parts and wiring layers can be reduced. According to a conventional multi-layer wiring board, thermal satisfaction is achieved by employing a thick-copper four-layer board in which the copper thickness of each wiring layer is 60 μm or more, or a six-layer board in which the copper thickness of each wiring layer is 35 μm; whereas, when the configuration of this application is used, a heat-dissipation capability that is equivalent to or greater than the above, can be achieved even using a four-layer board in which the copper thickness of each of a wiring layer and a GND layer is 35 μm. As a result, board cost can be reduced.

In addition, because the GND layers that are opposite to the respective lines of the wirings P and N in the main circuit are formed, capacity components are produced. Namely, these capacity components have a function equivalent to that of the Y-Cap, so that the Y-Cap may be omitted. Further, as compared with a lead-type capacitor, the ESL (Equivalent Series Inductance) components can be reduced. Thus, the high-frequency band characteristic of the filter is improved, so that the noise resistance performance is enhanced.

It is noted that, when, for the product of the power conversion device itself, there is a restriction on the input-terminal impedance from the product housing or the ground as a reference, in order that the impedance becomes within a range of allowable values, it is appropriate to adjust the respective overlapping areas where the portions of the first GND layer 23 and the second GND layer 24 from the input terminals of the main circuit to the current transformer, and the main-circuit wiring layers, that is, the first wiring layer 21 and the second wiring layer 22, are overlapped, respectively, with each other.

Further, it is preferable that each of the intervals between the first wiring layer 21 and the first GND layer 23 and between the second wiring layer 22 and the second GND layer 24 be not less than 120 μm but not more than 300 μm. When each of the intervals between the first wiring layer 21 and the first GND layer 23 and between the second wiring layer 22 and the second GND layer 24 is set to be not less than 120 μm but not more than 300 μm, the first wiring layer 21 and the first GND layer 23 are made close to each other as well as the second wiring layer 22 and the second GND layer 24 are made close to each other, while limiting the number of board's layers, so that it is possible for the board to concurrently establish: heat-dissipation capability; manufacturing cost reduction; and suppression of deterioration in insulation property. Further, when two or more prepreg layers are interposed between the first wiring layer 21 and the first GND layer 23, as well as between the second wiring layer 22 and the second GND layer 24, migration due to high-voltage application occurs between the board's layers, and this makes it possible to suppress deterioration in insulation performance.

Furthermore, with respect also to another main-circuit part of an SMD (Surface Mount Device) type, for example, a current-detection shunt resistor or the like, the first GND layer 23 and the second GND layer 24 may also be formed in respective regions between the external-layer portions 10a, 10b and the internal-layer portion 10c of the base board 10, and corresponding to that part.

According to a coil, a transformer or the like employed as a main-circuit part, at its mounting on the base board, when a conductor layer is placed all around under that part, a stray capacitance may be produced between the terminals of that part and in parallel to the inductor component of that part. Therefore, such a problem may arise that an originally-intended inductance characteristic cannot be obtained. For dealing with this problem, for example, in the case of the circuit configuration of FIG. 2, the above-described configuration is applied to a region B; however, in a region C from the current transformer 19c to the DC-AC circuit unit 14, the first GND layer 23 and the second GND layer 24 are caused not to be overlapped with the main-circuit wiring layers, that is, the first wiring layer 21 and the second wiring layer 22. This reduces the stray capacitance component produced between the terminals of that part.

In such a circuit having an inductance component as a lumped constant, when a portion from the current transformer to the DC/AC circuit unit 14 is overlapped with a capacitance component, to thereby get a stray capacitance component of several hundreds pF to several thousands pF, such a problem arises that a multiplied frequency of a resonance frequency established by the X-Cap, the current transformer and the DC-AC circuit, is fallen into the radio-frequency band. For dealing therewith, such a structure is employed in which no GND layer is formed around the region C. By employing such a structure for the wiring patterns, it is possible to suppress the resonance frequency established by the X-Cap, the current transformer and the DC-AC circuit unit in the main circuit, from producing a radio-frequency band noise.

Further, in the case where the main-circuit parts are placed on a central portion in a region formed by three or more fixing points for fixing screws 25, and when the board configuration as disclosed in this application is applied to the portion surrounded by the screws, because the number of the fixing points for fixing screws 25 is increased and the number of heat-dissipation paths is also increased, the cooling performance and the quake resistance are enhanced. Note that the control circuit such as a voltage sensor circuit for monitoring a voltage in the main circuit, or the like, may also be placed within the above region. Within that region, the heat-dissipation capability of the part in the control circuit can also be improved.

Further, when the main circuit-related GND and the control circuit-related GND in a form of a common GND are separated, it is possible to separate their common-noise paths into the path(s) for the main circuit and the path(s) for the control circuit, to thereby reduce occurrence of a false operation or the like, due to GND bounce and noise interference.

As shown above, the description has been made citing an AC-DC converter as an example; however, the technology in this application may be applied similarly to another power conversion device or the like, such as an on-vehicle battery charger, a DC-DC converter, an inverter or the like. The technology in this application may be applied to any structure so long as it is a structure in which, like in the foregoing example, the main-circuit parts are mounted on the base board and the base board is fixed to a housing or a cooler, and in that case, an effect similar to the foregoing is promising.

As described above, the power conversion device according to Embodiment 1 comprises:

the main circuit 101 which has: the first wiring layer and the second wiring layer 22 that are formed respectively on both surfaces of the base board 10; the surface mount parts 19 such as the X-Cap 19x, the Y-Cap 19y and the like, and the lead insertion part 20 such as the fuse 20f or the like, that are mounted on the first wiring layer 21 and the second wiring layer 22; and the first GND layer 23 and the second GND layer 24 that are formed respectively, between the external-layer portions 10a, 10b and the internal-layer portion 10c of the base board 10 and in regions corresponding to the above parts each being apart which forms a circuit other than a circuit having an inductance component as a lumped constant, and to the first wiring layer 21 and the second wiring layer 22; and the cooler 28 which is attached to the base board 10 by means of fixing screws through the first through-holes 26 each created in an end portion of that board;

wherein the first GND layer 23 and the second GND layer 24 are each formed so that a creepage distance is created around a second through-hole in which a lead of the lead insertion part 20 that connects the first wiring layer 21 and the second wiring layer 22 to each other, is inserted.

Thus, heat-dissipation paths are created around the target parts and wiring layers in the main circuit, so that heat generation at the parts and wiring layers can be reduced, and this allows to flow a much larger current. Accordingly, it is possible to flow a much larger current without increasing the number of board's layers or without increasing the copper thickness of the wiring pattern, so that board cost can be reduced. Further, it is possible to ensure thermal satisfaction for the main-circuit configuration parts mounted on the board and to enhance the noise resistance performance, concurrently.

Further, when the main circuit 101 is included in a region surrounded by three or more points at which attachment is made by means of fixing screws 25, not only the cooling performance is enhanced due to increased number of heat-dissipation paths, but also the quake resistance is enhanced.

Furthermore, when the control circuit for activating the main circuit 101 is also included in the region surrounded by the three or more points at which attachment is made by means of fixing screws 25, and has a configuration similar to the main circuit 101, it is also possible to improve the heat-dissipation capability, the noise resistance performance and the quake resistance of the control circuit.

Further, when the external-layer portions 10a, 10b are each formed of two prepreg layers, since migration due to high-voltage application occurs between the board's layers, it is possible to suppress deterioration in insulation performance.

Embodiment 2

In Embodiment 1, a case has been described where the wiring layers and the GND layers are layers of a four-layer board; whereas, in Embodiment 2, a case will be described where the wiring layers and the GND layers are layers of a six-layer board.

Figure 5:
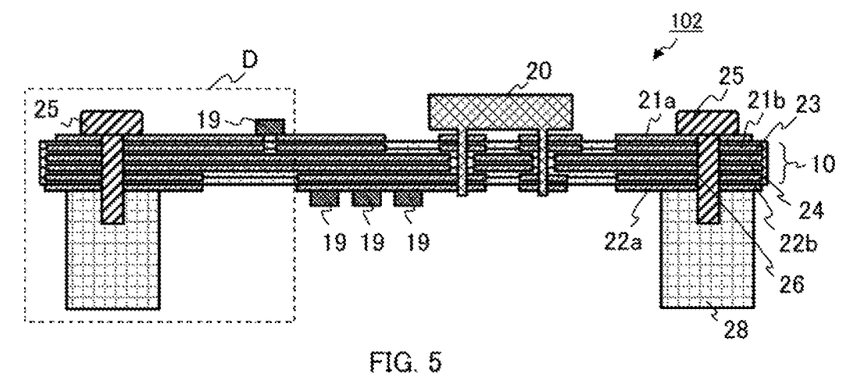
FIG. 5 is a sectional view showing a configuration of a main circuit of a power conversion device according to Embodiment 2.
Figure 6:
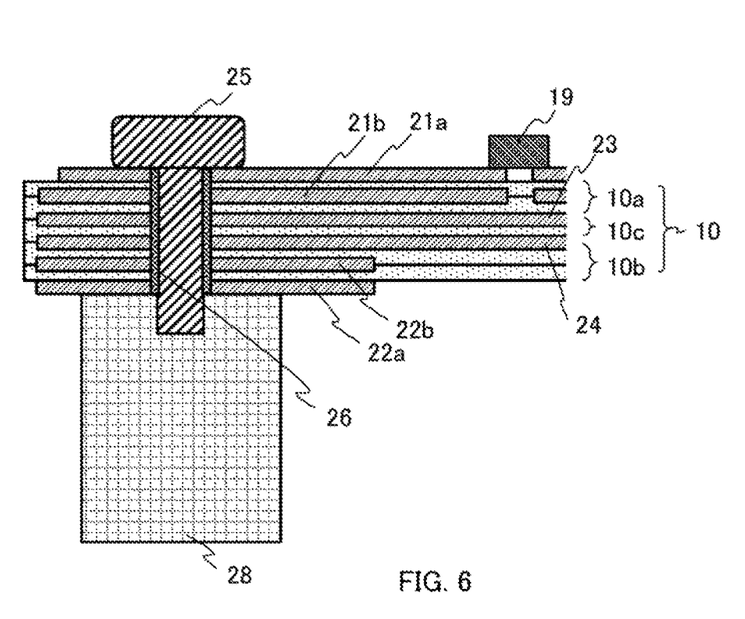
FIG. 6 is an enlarged sectional view showing a configuration of the main circuit of the power conversion device according to Embodiment 2.

FIG. 5 is a sectional view showing a configuration of a main circuit of a power conversion device according to Embodiment 2. FIG. 6 is an enlarged sectional view of a region D in FIG. 5. As shown in FIG. 5 and FIG. 6, a main circuit 102 of a power conversion device of Embodiment 2 results from further forming in the configuration of Embodiment 1, a third wiring layer (indicated at 21b in FIG. 5 and FIG. 6) and a fourth wiring layer (at 22b in FIG. 5 and FIG. 6), respectively, between the first wiring layer (at 21 in FIG. 1, at 21a in FIG. 5 and FIG. 6) and the first GND layer 23, and between the second wiring layer (at 22 in FIG. 1, at 22a in FIG. 5 and FIG. 6) and the second GND layer 24. The other configuration of the main circuit 102 of the power conversion device according to Embodiment 2 is similar to that in the main circuit 101 of the power conversion device of Embodiment 1, so that, for the equivalent portions, the same reference numerals are given and description thereof will be omitted.

Note that it is preferable that each of the intervals between the third wiring layer 21b and the first GND layer 23 and between the fourth wiring layer 22b and the second GND layer 24 be not less than 120 µm but not more than 300 µm. When each of the intervals between the third wiring layer 21b and the first GND layer 23 and between the fourth wiring layer 22b and the second GND layer 24 is set to be not less than 120 µm but not more than 300 µm, the third wiring layer 21b and the first GND layer 23 are made close to each other as well as the fourth wiring layer 22b and the second GND layer 24 are made close to each other, while limiting the number of board's layers, so that it is possible for the board to concurrently establish: heat-dissipation capability; manufacturing cost reduction; and suppression of deterioration in insulation property.

By employing such a configuration, in addition to getting the same effect as that obtained in Embodiment 1, it is possible to decrease the value of line resistance in the main-circuit pattern by increasing the number of wiring layers, and further to reduce heat generation at the parts and wiring layers in the main circuit 102, more effectively, because heat is dissipated also from the first GND layer 23 and the second GND layer 24 respectively formed between the external-layer portions 10a, 10b and the internal-layer portion 10c of the base board 10.

As described above, the main circuit 102 of the power conversion device according to Embodiment 2 further comprises: the third wiring layer 21b formed between the first wiring layer 21a and the first GND layer 23 through the external-layer portion 10a; and the fourth wiring layer 22b formed between the second wiring layer 22a and the second GND layer 24 through the external-layer portion 10b. Thus, in addition to getting the same effect as that obtained in Embodiment 1, it is possible to decrease the value of line resistance in the main-circuit pattern by increasing the number of wiring layers, and further to reduce heat generation at the parts and wiring layers in the main circuit, more effectively, because heat is dissipated also from the first GND layer and the second GND layer respectively formed between the external-layer portions and the internal-layer portion of the base board.

It is noted that, with respect to the wiring layers and the GND layers, a four-layer board and a six-layer board have been described in Embodiment 1 and Embodiment 2; however, this is not limitative. It is also allowed to increase the number of wiring layers between the first wiring layer 21a and the first GND layer 23, and the number of wiring layers between the second wiring layer 22a and the second GND layer 24.

In this application, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the present description. For example, such cases shall be included where at least one configuration element is modified; where any configuration element is added or omitted; and furthermore, where at least one configuration element is extracted and combined with a configuration element of another embodiment.

What is claimed is:

1. A power conversion device, comprising:
a main circuit which has: a first wiring layer and a second wiring layer that are formed respectively on first and second surfaces of a base board; a first plurality of mounted parts that are each mounted on the first wiring layer or the second wiring layer,
said first plurality of mounted parts including:
a mounted part having a lumped inductance component, and
a second plurality of mounted parts each having a respective component other than a lumped inductance component;
a first GND layer and a second GND layer that are formed respectively, between the external-layer portions and the internal-layer portion of the base board and in regions corresponding to the second plurality of mounted parts, and to the first wiring layer and the second wiring layer; and
a cooler which is attached to the base board by means of a fixing screw through a first through-hole created in an end portion of that board,
wherein the first GND layer and the second GND layer are each formed so that a creepage distance is created around a second through-hole in which a lead of one of the second plurality of mounted parts, that connects the first wiring layer and the second wiring layer to each other, is inserted.

2. The power conversion device according to claim 1, wherein each of the intervals between the first wiring layer and the first GND layer and between the second wiring layer and the second GND layer is not less than 120 μm but not more than 300 μm.

3. The power conversion device according to claim 1, further comprising: a third wiring layer formed between the first wiring layer and the first GND layer through one of the external-layer portions; and a fourth wiring layer formed between the second wiring layer and the second GND layer through the other external-layer portion.

4. The power conversion device according to claim 3, wherein each of the intervals between the third wiring layer and the first GND layer and between the fourth wiring layer and the second GND layer is not less than 120 μm but not more than 300 μm.

5. The power conversion device according to claim 1, wherein the main circuit is included in a region surrounded by three or more points at each of which the cooler is attached by means of the fixing screw.

6. The power conversion device according to claim 2, wherein the main circuit is included in a region surrounded by three or more points at each of which the cooler is attached by means of the fixing screw.

7. The power conversion device according to claim 3, wherein the main circuit is included in a region surrounded by three or more points at each of which the cooler is attached by means of the fixing screw.

8. The power conversion device according to claim 4, wherein the main circuit is included in a region surrounded by three or more points at each of which the cooler is attached by means of the fixing screw.

9. The power conversion device according to claim 1, wherein each of the external-layer portions is formed of two prepreg layers.

10. The power conversion device according to claim 2, wherein each of the external-layer portions is formed of two prepreg layers.

11. The power conversion device according to claim 3, wherein each of the external-layer portions is formed of two prepreg layers.

12. The power conversion device according to claim 4, wherein each of the external-layer portions is formed of two prepreg layers.

* * * * *